US006852139B2

(12) United States Patent
Zhang et al.

(10) Patent No.: US 6,852,139 B2
(45) Date of Patent: Feb. 8, 2005

(54) SYSTEM AND METHOD OF PRODUCING THIN-FILM ELECTROLYTE

(75) Inventors: Ji-Guang Zhang, Marietta, GA (US); Lamartine Meda, Atlanta, GA (US); Eleston Maxie, Marietta, GA (US)

(73) Assignee: Excellatron Solid State, LLC, Atlanta, GA (US)

( * ) Notice: Subject to any disclaimer, the term of this patent is extended or adjusted under 35 U.S.C. 154(b) by 0 days.

(21) Appl. No.: 10/617,839

(22) Filed: Jul. 11, 2003

(65) Prior Publication Data

US 2005/0008772 A1 Jan. 13, 2005

(51) Int. Cl.[7] ............................................. H01M 10/38
(52) U.S. Cl. ...................... 29/623.5; 429/322; 429/162; 423/306
(58) Field of Search ........................ 29/623.5; 429/322, 429/162; 423/306

(56) References Cited

U.S. PATENT DOCUMENTS

| | | | |
|---|---|---|---|
| 3,237,078 A | 2/1966 | Mallory ........................ 320/17 |
| 3,393,355 A | 7/1968 | Whoriskey et al. ............ 320/18 |
| 4,154,902 A | 5/1979 | Schwartz ..................... 429/15 |
| 4,303,877 A | 12/1981 | Meinhold ..................... 320/18 |
| 4,614,905 A | 9/1986 | Petersson et al. ............. 320/18 |
| 4,654,281 A | 3/1987 | Anderman et al. .......... 429/209 |
| 4,719,401 A | 1/1988 | Altmejd ........................ 320/13 |
| 4,730,383 A | * 3/1988 | Balkanski ................... 29/623.5 |
| 4,996,129 A | 2/1991 | Tuck ........................... 429/194 |
| 5,270,635 A | 12/1993 | Hoffman et al. ............... 320/21 |
| 5,291,116 A | 3/1994 | Feldstein ........................ 320/4 |
| 5,314,765 A | 5/1994 | Bates .......................... 429/194 |
| 5,336,573 A | 8/1994 | Zuckerbrod et al. ......... 429/252 |
| 5,338,625 A | 8/1994 | Bates et al. .................. 429/193 |
| 5,362,581 A | 11/1994 | Chang et al. ................ 429/249 |
| 5,387,857 A | 2/1995 | Honda et al. .................. 320/18 |
| 5,411,592 A | 5/1995 | Ovsbinsky et al. .......... 118/718 |
| 5,445,906 A | 8/1995 | Hobson et al. .............. 429/162 |
| 5,455,126 A | 10/1995 | Bates et al. .................. 429/127 |
| 5,512,147 A | 4/1996 | Bates et al. ............. 204/192.15 |
| 5,561,004 A | 10/1996 | Bates et al. .................. 429/162 |
| 5,567,210 A | 10/1996 | Bates et al. ................. 29/623.5 |
| 5,569,520 A | 10/1996 | Bates .......................... 429/162 |
| 5,589,291 A | 12/1996 | Carlin et al. ................. 429/103 |
| 5,597,660 A | 1/1997 | Bates et al. .................. 429/191 |
| 5,612,152 A | 3/1997 | Bates .......................... 429/152 |
| 5,654,084 A | 8/1997 | Egert .......................... 428/215 |
| 5,778,515 A | 7/1998 | Menon ....................... 28/623.4 |
| 5,783,928 A | 7/1998 | Okamura ..................... 320/122 |
| 5,811,205 A | 9/1998 | Andrieu et al. .............. 429/137 |
| 5,821,733 A | 10/1998 | Turnbull ...................... 320/116 |
| 5,932,375 A | 8/1999 | Tarcy et al. ............ 429/231.95 |
| 6,071,797 A | 6/2000 | Endo et al. .................. 438/488 |
| 6,197,450 B1 | 3/2001 | Nathan et al. ............... 429/236 |
| 6,235,425 B1 | 5/2001 | Hanson et al. ............... 429/209 |
| 6,254,844 B1 | * 7/2001 | Takeuchi et al. ............. 423/306 |
| 2002/0150823 A1 | * 10/2002 | Breitkopf et al. ........... 429/245 |

OTHER PUBLICATIONS

Journal of Power Sources, P. Fragnaud, R. Nagarajan, D. M. Schleich, D. Vujic, Thin–film cathodes for secondary lithium batteries, 1995 (no month).

(List continued on next page.)

*Primary Examiner*—John S. Maples
(74) *Attorney, Agent, or Firm*—Baker Donelson (57) ABSTRACT

A process of producing a thin film electrolyte is provided wherein a volatile lithium-containing precursor and a volatile phosphate-containing precursor are mixed into a plasma generated from a plasma source. The mixture is then deposited upon a substrate. The process is conducted with the use of a system (11) having a plasma source (13) having a primary plenum (16) and a secondary plenum (23). The primary plenum is in fluid communication with a source of nitrogen gas (47) and a source of hydrogen gas (51). The secondary plenum is in fluid communication with a first bubbler (31) and a second bubbler (38).

18 Claims, 11 Drawing Sheets

OTHER PUBLICATIONS

Materials Research Society, The preparation and Characterization of Lithium Cobalt Oxide Thin Films by LPCVD, 1996 no month.

Journal of Power Sources, Thin film solid electrolytes and electrodes for rechargeable lithium–ion batteries, J. Schoonman, E.M. Kelder, 1997 no month.

Solid State Ionics, Fabrication of LiCoO2 thin film cathodes for rechargeable lithium battery by electrostatic spray pyrolysis, C.H. Chen et al., 1995 no month.

Journal of Materials Science, Unique pourous LiCoO2 thin layers prepared by electrostatic spray deposition. C.H. Chen et al., 1996 no month.

Chemical Congress, Hiroshima, May 1997.

Materials Research Society, vol. 369, 1995, pp. 136–147.

Reprint from Journal of the Electrochemical Society, vol. 144, No. 2, Feb. 1997.

Li–Ion Thin–Film Batteries with Tin and Indium Nitride and Subnitride Anodes MeNx (Me=Sn, In) B.J. Neudecker and R.A. Zuhr, Nov. 1999.

Solid State Ionics 53–26 (1992) 647–654 North Holland, "Electrical properties of amophous lithium electrolyte thin films" J.B. Bates et al. 1992 no month.

Journal of the Electrochemical Society, 148 (11) A1260–A 1265 (2001) "Electrochemical Properties of Carbonaceous Thin Films Prepared by Plasma Chemical Vapor Deposition" Tomokazu Fukutsuka et al.

* cited by examiner

| Element | Atomic Percent |
|---|---|
| Li | 25 |
| P | 17 |
| O | 49 |
| N | 4.0 |
| C | 4.8 |

Fig. 5

| Element | Atomic Percent |
|---------|----------------|
| Li | 23 |
| P | 17 |
| O | 24 |
| N | 9.1 |
| C | 10 |
| F | 17 |

Fig. 6

| Element | Atomic Percent |
|---------|---------------|
| Li | 28 |
| P | 18 |
| O | 54 |

Fig. 7

| Element | Atomic Percent |
|---|---|
| Li | 37 |
| P | 12 |
| O | 33 |
| N | 4.2 |
| C | 4.8 |
| F | 9.7 |

SYSTEM AND METHOD OF PRODUCING THIN-FILM ELECTROLYTE

This invention was made with United States Government support under Contract No. 70NANB1H3043 awarded by the National Institute of Standards and Technology (NIST). The United States Government has certain rights in the invention.

TECHNICAL FIELD

This invention relates to systems for producing solid electrolytes and more specifically solid electrolytes utilized in thin-film batteries, and the method of producing such.

BACKGROUND OF THE INVENTION

Intensive work has been done in the last two decades on the development of high performance lithium ion batteries, especially on polymer based lithium ion batteries (W. H. Meyer, Advanced Materials, V10. No. 6, 439 (1998); M. Z. A. Munish, in Handbook of Solid State Batteries and Capacitors, Chapter 19. Ed. By M. Z. A. Munish, World Scientific Pub. Singapore, 1995). These include two major strategies on using ion-conducting polymers as electrolyte in lithium batteries have been used. The first strategy is the development of highly conductive materials via the cross linking of mobile chains to form networks, which are then swollen by lithium salt solutions or electrolyte. The matrix in which the ion transport occurs is liquid-like. One example of gel electrolyte is the polymer battery (PLiON™) developed by Gozdz et al (A. S. Gozdz, C. N. Schmutz, and J.-M. Tarascon, U.S. Pat. No. 5,296,318, Mar. 22, 1994; A. S. Gozdz, C. N. Schmutz, J. M. Tarascon, and P. C. Warren, U.S. Pat. No. 5,456,000, Oct. 10, 1995; J. M. Tarascon, A. S. Gozdz, C. Schmutz, F. K. Shokoohi, P. C. Warren, Solid State Ionics, 86, 49 (1996); A. S. Gozdz, T. Falls, C. N. Schmutz, and P. C. Warren, U.S. Pat. No. 5,587,253, Dec. 24, 1996). In this case, the liquid electrolyte is absorbed in a polymer membrane based on polyvinylidene fluoride (PVDF) polymer in a manner similar to a sponge holding water. Although these batteries can be prepared in prismatic form, their market access is still hindered by the safety concerns and degassing problems associated with liquid electrolyte used in the batteries.

The second strategy in the development of polymer batteries is the construction of solid polymer electrolytes (SPEs) with reasonable conductivity but without the addition of a liquid electrolyte. One polymer widely investigated is poly (ethylene oxide) or PEO, which is able to form stable complexes with a number of salts (D. E. Fenton, J. M. Parker, P. V. Wright, Polymers, 14,589 (1973). It exhibits low ionic conductivity ranging from $10^{-9}$ to $10^{-8}$ S/cm at ambient temperature. Steady improvements over PEO based polymer electrolytes have been made since Fenton et al. early work in 1973. For example, Munishi and Zafer (M. Munishi and a. Zafar, international publication number WO 01/17051. Mar. 8, 2001; M. Munishi and A. Zafar, international publication number WO 01/17052. Mar. 8, 2001) reported polymer electrolytes that have a room temperature conductivity of between $10^{-5}$ to $10^{-4}$ S/cm. It consisted of a base polymer material with the plasticizer salt, inorganic filler and glassy or ceramic lithium ion conductor. Although these new polymers may improve the room temperature properties of lithium ion batteries, their operating temperature range (10 to 70° C.) is still very limited. For example, a PEO based electrolyte has a crystalline temperature range of 65–70° C. These polymers show a rapid decline in conductivity below the crystalline temperature. In fact, a PEO—LiClO$_4$ electrolyte exhibits an ionic conductivity at ambient temperature of about $10^{-9}$ to $10^{-4}$ S/cm. Therefore, the batteries using these polymer electrolytes have to operate at more than 100° C. in order to be of any use. Another disadvantage of these polymer-based batteries is that they cannot use lithium metal as the anode although lithium has the highest energy density among all anode materials. This is because these polymers do not have enough mechanical strength to prevent lithium dendrite growth during the charge/discharge process.

Significant progress has been achieved in the last decade on the development of inorganic, solid state electrolytes. One of the best examples is the glassy lithium phosphorus oxynitride ("LiPON") electrolyte developed by Bates et al in Oak Ridge National Laboratory (John Bates, Nancy Dudney, Greg Gruzalski, and Christopher Luck, U.S. Pat. No. 5,338,625, Aug. 16, 1994; X. Yu, J. B. Bates, G. E. Jellison, and B. C. Sales, J. Electrochem. Soc. 144, 524 (1997); B. J. Neudecker, R. A. Zuhr, in Intercalation Compounds for Battery Materials. Ed. By G. A. Nazri, M. Thackery, and T. Ohzuku, Electrochemical Society Proceeding V. 99-24, page 295). This solid-state electrolyte has a typical composition of $Li_{2.9}PO_{3.3}N_{0.36}$ and is deposited by sputtering from a hot pressed $Li_3PO_4$ target in a nitrogen environment. It has a conductivity of $2*10^{-6}$ S/cm and is stable in contact with metallic lithium at potentials from 0 to nearly 5.5 V. Thin film batteries that used this electrolyte have demonstrated a cycle life of more than 40,000 full depth of charge-discharge cycles which is unthinkable for any other type of batteries. Thin film battery designs are also more flexible in their use of materials. Since a thin layer of material has a lower electrical resistance, it is possible to use some materials that could not be used in conventional bulk batteries (C. Julien and G. A. Nazri, "Solid State Batteries: Materials Design and Optimization," Boston: Kluwer, 1994, p579).

To date, magnetron sputtering is the primary method used in the thin film battery industry for LiPON deposition. Magnetron sputtering is a well-established manufacturing method for depositing metal films at high rates, typically greater than 600 Å/min. However, the deposition rate from sputtering ceramic targets typically is low, at approximately 100 Å/min for LiPON film. Therefore, the cost of producing LiPON films is still prohibitively high for large-scale applications. Several other deposition techniques have been investigated for the preparation of LiPON films. For example, Vereda et al (Fernado Verda, Ronald B. Goldner, Terry E. Hass, and Peter Zerigian, Electrochemical and Solid-State Letters, 5(11) A239 (2002)) and Jenson et al (Mark Lynn Jenson and Victor Henry Weiss, U.S. patent application Ser. No. 815,983/09 Mar. 23, 2001) used an Ion Beam Assisted Deposition method to prepare LiPON films, but this method is difficult to scale up due to high equipment cost. Attempts to deposit electrolyte films by reactive electron beam evaporation in $N_2$ environment were not successful. These results indicate that the formation of Lipon not only relies on the stoichiometry, but also on the special microstructure determined by the preparation conditions.

In summary, polymer electrolyte films still cannot satisfy the requirement for many advanced applications due to their limited operating temperature range and instability. Although solid electrolyte (LiPON) developed by Bates et al can overcome this instability problem, the high cost of the sputtering process has hindered its large-scale applications. Therefore, there is an urgent need for a solid-state electrolyte that exhibits a high ionic conductivity, wide operating temperature range, and can be prepared by a low cost production method. It is to the provision of such need that the present invention is primarily directed.

SUMMARY OF THE INVENTION

A process for producing a thin film electrolyte layer comprises the steps of providing a plasma source coupled to a supply of plasma gas so as to emit a plasma stream that is directed to a substrate positioned adjacent the plasma source, vaporizing a volatile lithium containing precursor, vaporizing a volatile phosphate containing precursor, transporting the vaporized volatile lithium containing precursor to the plasma source, transporting the vaporized volatile phosphate containing precursor to the plasma source, and expelling the vaporized volatile lithium containing precursor and vaporized volatile phosphate containing precursor from the plasma source and into the plasma stream emitted from the plasma source. The volatile lithium containing precursor and volatile phosphate containing precursor are prevented from mixing with the plasma gas prior to the gas being expelled from the plasma source as a plasma stream.

DETAILED DESCRIPTION

With reference next to the drawings, there is shown a system 10 for depositing a thin-film battery electrolyte in a preferred form of the invention. The system 10 includes a platen or substrate holder 11 which can be either grounded or biased by an external power supply, an electric heater 12 positioned below the substrate holder 11, and a high-density plasma (HDP) source 13.

The plasma source 13 may be a model HCD-P-100 13.56 MHz Planar Hollow Cathode RF Plasma Source made by JE PlasmaConsult GmbH of Wuppertal, German. This plasma source 13 is shown in detail in FIG. 2. The plasma source 13 has a first or primary plenum 16 in fluid communication with a plasma gas intake pipe 17 with an annular array of chambers 18 extending to an annular array of nozzles 19 aligned within a bottom plate 21 with a similar arrangement of passages 22. The bottom plate 21 acts as a grounding electrode or anode. The plasma source 13 also has a second or secondary plenum 23 in fluid communication with the precursor intake pipe 24. The second plenum 23 extends to an annular array of expulsion nozzles 25 within the bottom plate 21. The primary plenum 16 is coupled to an RF power source so that it is a charged electrode or cathode, which is electrically insulated from the bottom plate 21. The plasma source bottom plate 21 may also be referred to as a showerhead as passages 22 and nozzles 25 are conventionally arranged in intermittent fashion between each other. The plasma source 13 also has a temperature control system 27 which includes circulation tubes 28 and a circulation plate 29 which controls the temperature of the plasma source.

Figure 1:
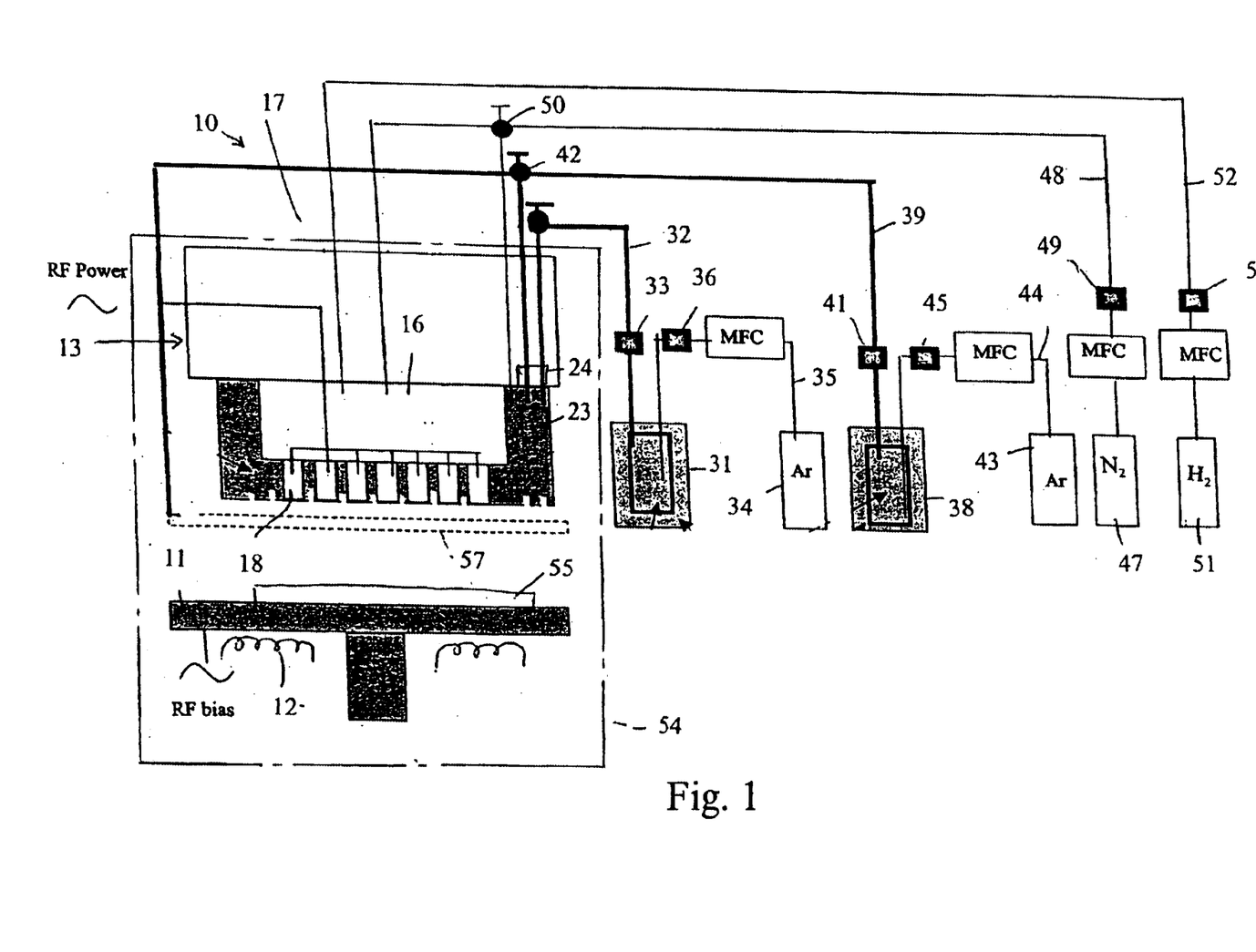
FIG. 1 is the schematic of a plasma enhanced chemical vapor deposition (PECVD) system used for carrying out the present invention in a preferred form.

The system 10 also has a first metal organic bubbler 31 coupled to the plasma source precursor intake pipe 24 through a first gas line 32 having a shut off valve 33. A first supply of argon gas 34, which acts as a carrier for the precursor within the first bubbler 31, is in fluid communication with the first bubbler 31 through as second gas line 35 having a shut offvalve 36. The system 10 also has a second metal organic bubbler 38 coupled to the plasma source precursor intake pipe 24 through a third gas line 39 having a shut off valve 41 and a three way valve 42. A second supply of argon gas 43, which acts as a carrier for the precursor within second bubbler 38, is in fluid communication with the second bubbler 38 through a fourth gas line 44 having a shut off valve 45. It should be understood that the argon gas may be replaced with other gases which are non-reactive with the precursor, such as helium. The system 10 also has a supply of nitrogen gas 47 coupled to the plasma gas intake pipe 17 through a gas line 48 having a shut off valve 49 and a three way valve 50, and a supply of hydrogen gas 51 coupled to the plasma gas intake pipe 17 of the plasma source through a gas line 52 having a shut off valve 53. Other gases may be utilized as an alternative to the nitrogen or hydrogen shown in the preferred embodiment, such as oxygen, which, in fact, helps in the removal of organics such as carbon found in the precursor.

The system is conventionally controlled through a personal computer and is contained within an electro-polished stainless steel vacuum chamber 54 having an approximate dimension of 14×inches×14 inches×14 inches. The high-density plasma (HDP) source (13.56 MHz) has a maximum input power of 600 W. The system base pressure is $1.6 \times 10^{-6}$ torr with a deposition pressure is 0.05 to 10 torr. The substrate is heated by heated substrate holder 11 to a temperature of between 20 to 350° C. The plasma gas lines 48 and 52 are heated to a temperature between 20 to 150° C. The main precursor gases generated by the first organic bubbler 31 are passed through heated gas line 32 and into the secondary plenum 23 wherein it is activated by low energy plasma jets shot out from the primary plenum nozzles 19, therefore avoiding premature decomposition by avoiding contact with the plasma until immediately before being deposited upon a substrate 55. An optional gas ring 57 may be in fluid communication with gas line 39 and positioned adjacent to the bottom plate 21 to provide another or an alternative introduction area of a low energy precursor species to participate in the reaction near the surface of the substrate 55. The flow of precursor gas to the gas ring 57 is controlled through three-way valve 42. All precursors with different ionization energy will mix together and form the desired species when they reach the surface of the substrate 55. The distance between the platen or substrate holder 11 and the top electrode is normally set at 3.81 cm unless specified otherwise, as it can be adjusted with a range of 1.27 cm to 5 cm.

The following criteria were utilized in practicing the invention. The lithium precursors may be lithium tert-butoxide (LiTBO), lithium hexafluroisoproxide, LiOCH$(CF_3)_2$ (LiHFI), or lithium tetramethylheptanedionate (LiTMHD), or other volatile lithium containing precursor. The phosphate precursor may be triethylphosphate OP$(OC_2H_5)_3$ (TEPO), trimethyl phosphate (TMPO), or other volatile phosphate containing precursor. LiTBO is a solid powder with slightly yellowish color and has a vapor pressure of 30 mTorr at 110° C. This precursor is moisture and air sensitive and must therefore be handled in a glove box. LiHFI is a white solid powder and has a vapor pressure of 50 mTorr at 50° C. This substance can be easily synthesized from lithium hydride (LiH) and the corresponding alcohol (hexafluoro-2-propanol) using glove box and Schlenk techniques. TEPO has a vapor pressure of 1 Torr at 40° C.

Figure 2:
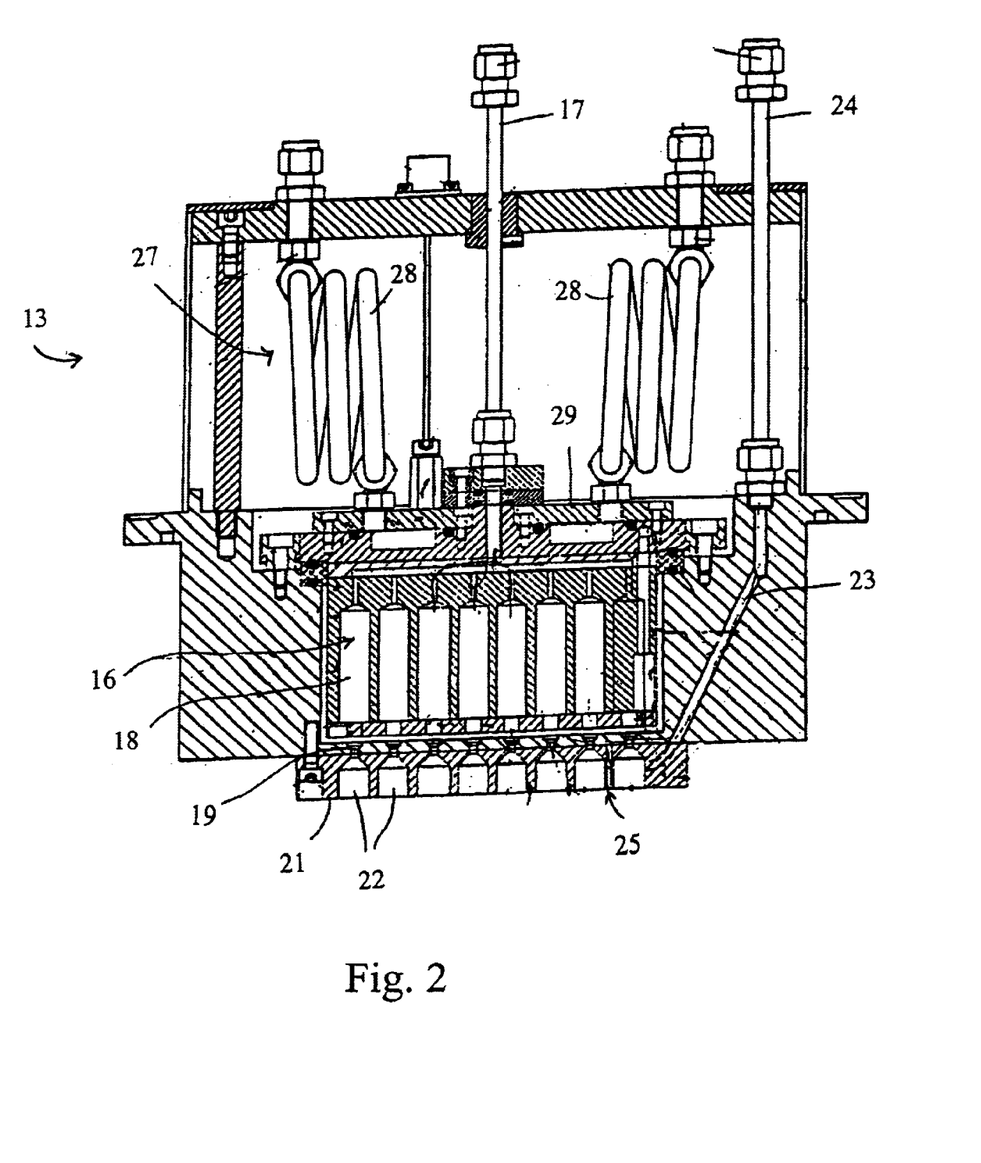
FIG. 2 is a cross-sectional view of the plasma source of the system of FIG. 1.

The system utilized 150-ml vertical style bubblers with fill ports in which the precursors may be loaded. Gas lines 32 and 39 are heated to a temperature 5 to 10° C. higher than the precursor operating temperature to prevent condensation of the precursor within the gas lines. The precursors are transported individually through the gas lines and mixed together immediately before entering the secondary plenum 23. To facilitate the precursor transportation, the showerhead or bottom plate 21 is heated to approximately 115° C. by passing heated ethylene glycol through the circulation tube 28 and circulation plate 29. Both precursors are transported through the showerhead, or alternatively one precursor is transported through the showerhead and the other precursor is transported through the gas ring 57.

The substrate 55, such as Indium Tin Oxide (ITO) coated glass or gold coated ceramics ($Al_2O_3$), is loaded on top of a silicon wafer using Kapton tape which is used as a mask and to hold the substrate to the wafer. The silicon wafer substrate 55 is then positioned upon the substrate holder 11 within the chamber 54. The system is then pumped down to approximately $10^{-5}$ Torr and the substrate temperature is brought to between 50 and 300° C. for a particular deposition. The $N_2$ gas is then introduced into the plasma source 13 so as to become a plasma or plasma gas within the chamber. The experiments conducted by the Applicant indicate that hydrogen is effective in removing carbon and fluorine impurities from electrolyte films. Therefore, a small amount of hydrogen may also be added to plasma gas as an alternative to or in conjunction with the oxygen gas.

With these parameters a plasma starts within the chamber 54 as the pressure reaches 1.5 Torr. After the plasma is created, the chamber pressure is set to between 0.05 to 10 Torr. Once the system stabilizes, valves 33 and 41 associated with the bubblers' gas lines 32 and 39 are opened slowly until the system pressure stabilizes. The RF power applied to the plasma showerhead may be varied between 10 to 600 Watts. This corresponds to a power density of 0.055 to 3.3 W/cm$^2$ for the 6" (15.24 cm) diameter showerhead used in this invention.

With the volatile lithium containing precursor and the volatile phosphate-containing precursor flowing into the secondary plenum 23, and the nitrogen gas and oxygen and/or hydrogen gas flowing into the primary plenum 16 or plasma gas ring 57, the invention yielded the following solid electrolyte films, as outlined in more detail hereafter.

The films were analyzed by x-ray diffraction (XRD) (Scintag Diffractomer), scanning electron microscopy equipped with an energy dispersive x-ray spectrometer (SEM/EDS, JEOL 800), profilometer (DekTak), inductively couple plasma (ICP) and X-ray photoelectron spectroscopy (XPS). After depositing a set of conductive gold bar (~2,000 Å thick) on the top of solid electrolyte by thermal evaporation, the conductivity of the solid-state electrolyte films was measured by using an Electrode Impedance Spectrometer (IM6e, Biological Analysis Inc.) within a frequency range of 0.1 Hz to 1 M Hz.

In practice, a LiHFI precursor has an advantage in that it has significant vapor pressure at only 55° C. and the precursor line can easily be heated to the slightly higher temperature necessary to prevent condensation. However, this precursor will introduce fluorine contamination in the electrolyte film that is detrimental to the ionic conductivity of the film. LiTBO proved to be a better choice for the lithium precursor as long as the temperature of the precursor transport line can be controlled at approximately 120° C. The deposition parameters for solid electrolyte films used in this invention are described in Table 1.

TABLE 1

The deposition parameters for Solid Electrolyte thin film

| Substrate temperature | 50 to 300° C. |
|---|---|
| LiTBO bubbler temperature | 115° C. |
| Phosphorus bubbler temperature | 20 to 40° C. |
| Gas line temperature | 115 to 150° C. |
| Process pressure | 0.05 to 10 torr |
| Ar flow rate through Li bubbler | 10 to 200 sccm |
| Lithium bubbler pressure | 1–20 torr |
| Ar flow rate through P bubbler | 1 to 10 sccm |
| Phosphorus bubbler pressure | 1 to 10 torr |
| N2 flow rate (Plasma) | 10 to 100 sccm |
| H2 flow rate (Plasma) | 1 to 10 sccm |
| RF power | 50 to 300 Watts |
| Distance between electrodes | 1.27 to 3.81 cm |
| Substrates | ITO coated glass or Au coated Au/Co/Al$_2$O$_3$ |

Figure 3:
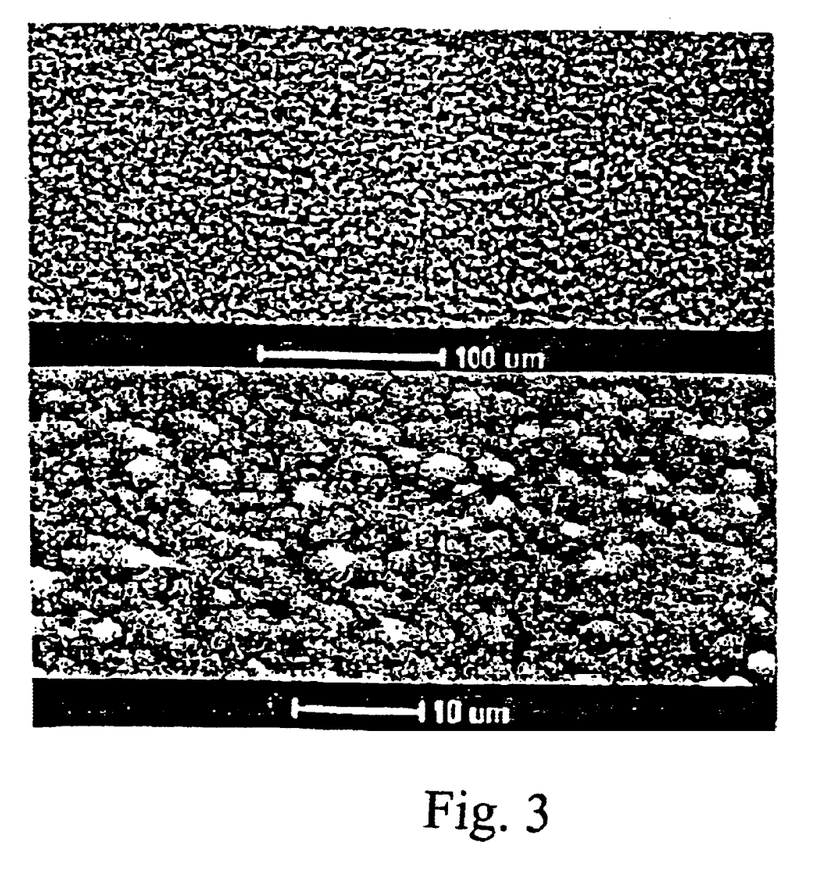
FIG. 3 is a photocopy of a photograph showing the morphology of electrolyte film deposited in accordance with the present invention.
Figure 4:
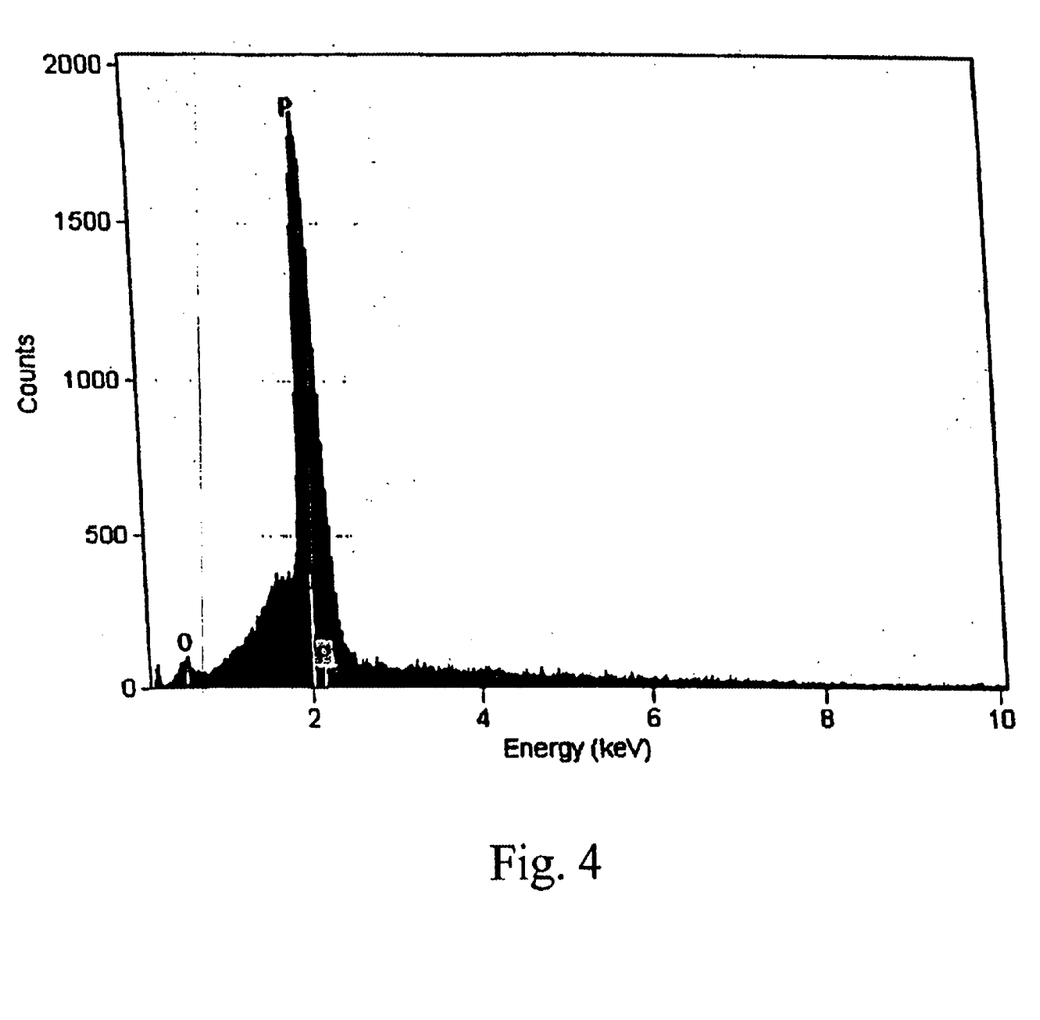
FIG. 4 is a graph showing the composition of the electrolyte film deposited in accordance with the present invention.

FIGS. 3 and 4 show the morphology and composition of electrolyte film deposited by PECVD process. FIG. 3 shows the surface morphology of a solid electrolyte film measured by scanning electron microscopy (SEM). FIG. 4 is a graph which shows the surface analysis of the electrolyte film by energy dispersive spectroscopy (EDS).

Figure 5:
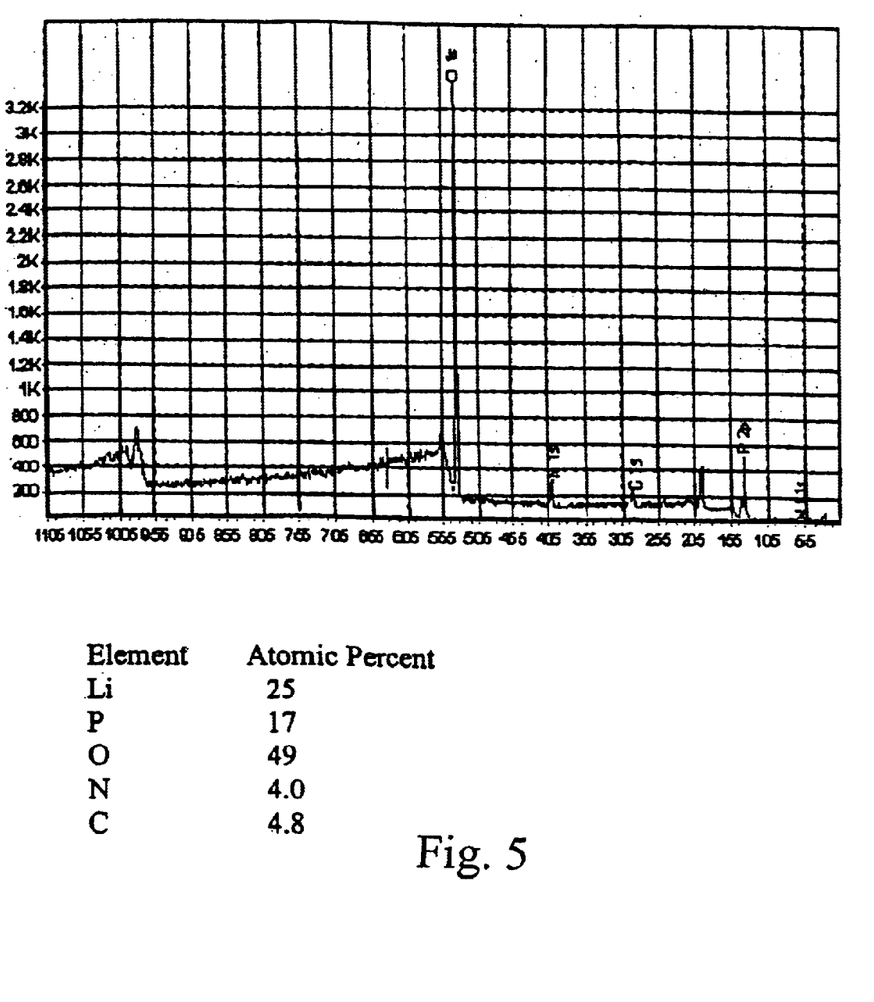
FIG. 5 is a graph which shows the XPS spectrum of an electrolyte film and corresponding composition analysis for LiPON film prepared by conventional sputtering from a $Li_3PO_4$ target in $N_2$ environment.
Figure 6:
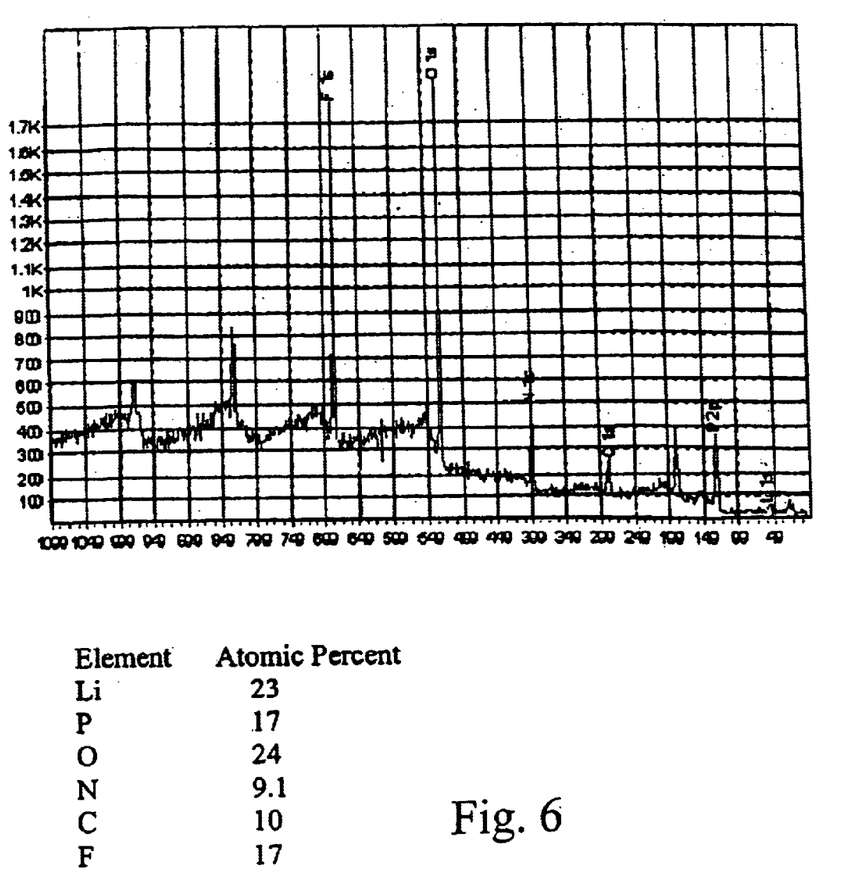
FIG. 6 is a graph which shows the XPS spectrum of an electrolyte film prepared in accordance with the present invention where a fluorinated precursor was used.

The compositions of the films were further analyzed by x-ray photoelectron spectroscopy (XPS). FIG. 5 shows the XPS spectrum of electrolyte film and corresponding composition analysis for a standard LiPON film prepared by sputtering from Li$_3$PO$_4$ target in N$_2$ environment. FIG. 6 shows the XPS spectrum and corresponding composition analysis of an electrolyte film prepared by PECVD (deposited at 180° C., 350 mTorr, 150 Watts) using LiHFI and TEPO precursors. The composition analysis indicated that electrolyte films deposited by PECVD process, shown in FIG. 6, has a similar lithium and phosphorus composition as those of standard LiPON films shown in FIG. 5. The main difference between the two samples is that the PECVD deposited films contain 17% fluorine, which is introduced by the fluorinated lithium precursor lithium hexafluoroisoproxide.

Figure 7:
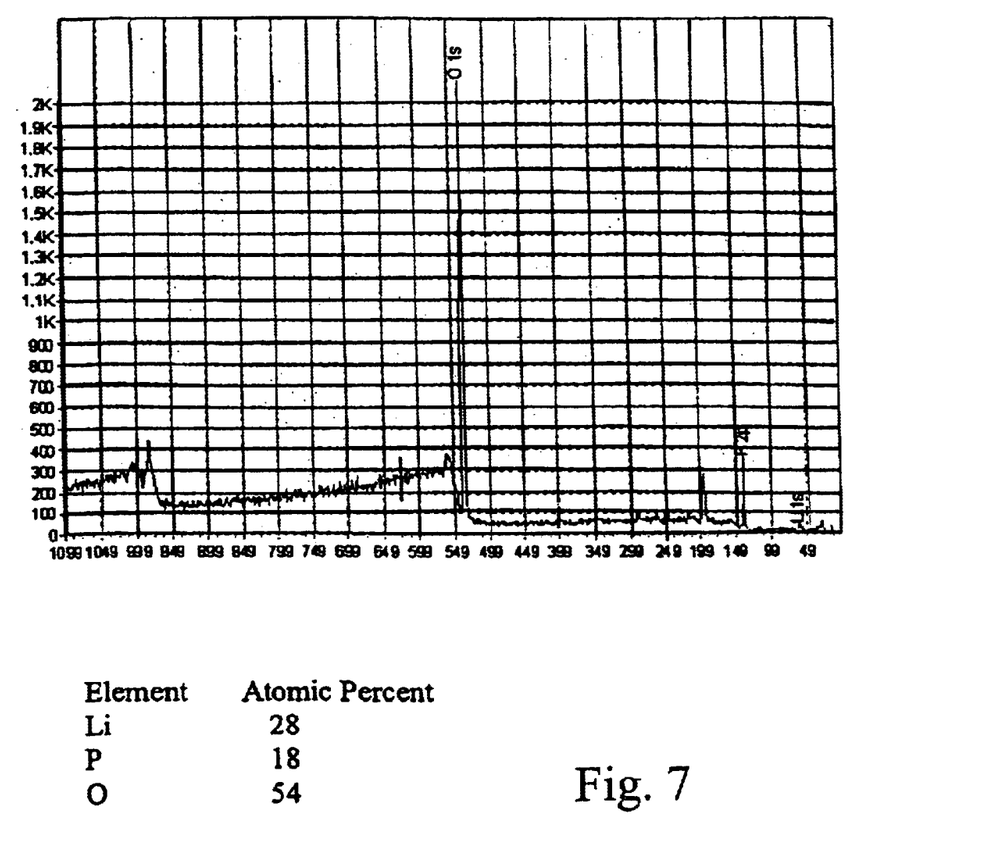
FIG. 7 is a graph which shows the XPS spectrum of an electrolyte film prepared in accordance with the present invention where oxygen was added to nitrogen plasma gas.
Figure 8:
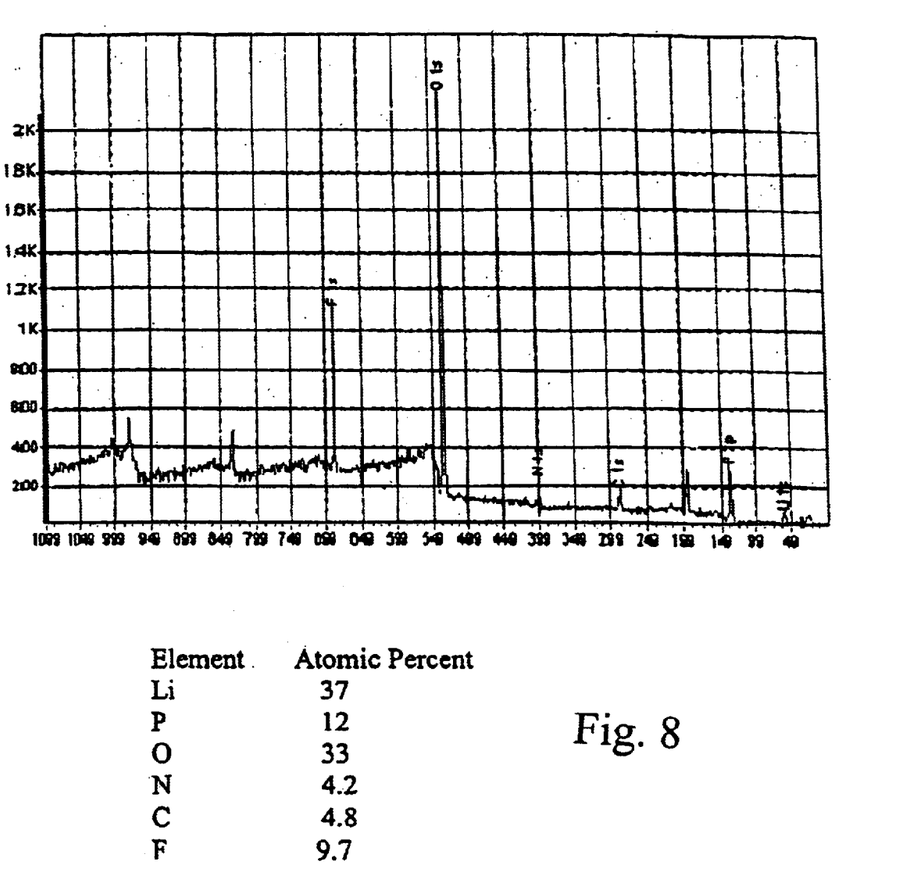
FIG. 8 is a graph which shows the XPS spectrum of an electrolyte film prepared in accordance with the present invention where pure nitrogen was used as the plasma gas.

FIG. 7 shows the XPS spectrum of an electrolyte film and corresponding composition analysis when a mixture of $O_2$ and $N_2$ is used as the plasma gas. Nitrogen disappeared in the films when oxygen was introduced into the plasma. However, as shown in FIG. 8, which is an XPS spectrum and corresponding composition analysis of an electrolyte film produced with a pure $N_2$ as the plasma gas, the films regained their nitrogen content. This comparison clearly indicated that introduction of $O_2$ hindered the incorporation of nitrogen in the LiPON films, most probably by the formation of a gaseous oxy-nitride compound that escapes through the exhaust. A comparison of the film compositions prepared at different conditions is shown below in Table 2. This table indicates that the solid electrolyte films prepared by the inventive PECVD process are very close to those of a standard LiPON film prepared by sputtering method, although the fluorine and carbon contaminations have to be minimized or eliminated.

TABLE 2

Atomic Percent of LiPON Films Prepared by Various Methods

| Preparation method | Sputtering | PECVD | | |
|---|---|---|---|---|
| Li Precursor | Li3PO4 target | LiHFI | LiTBO | LiTBO |
| Plasma gas | Ar—$N_2$ | $N_2$ | $N_2$ & $O_2$ | $N_2$ |
| Li | 25 | 23 | 28 | 33 |
| P | 17 | 17 | 18 | 13 |
| O | 49 | 24 | 54 | 34 |
| N | 4 | 9.1 | | 8.3 |
| C | 4.8 | 10 | | 11 |
| F | 0 | 17 | | 1.1 |

All the as-deposited films were amorphous and slightly yellowish, which is similar to those deposited by RF-sputtering (physical vapor deposition). In the inventive method, growth rates varied from 50 to 415 Å/min depending on the deposition conditions. EDS analyses detected the presence of O and P on most of the films and the XPS analyses revealed Li, P, O, N, and C compositions. Film stoichiometry varied depending on the process conditions. The ionic conductivity of the films varied between $3.1*10^{-7}$ S/cm to $5.8*10^{-6}$ S/cm depending on the deposition conditions.

The following are examples produced in accordance with the invention herein.

EXAMPLE I

In one experiment, lithium tert-butoxide (LiTBO) and triethylphosphate $OP(OC_2H_5)_3$ (TEPO) were used as lithium and phosphate precursors, respectively. The bubblers with lithium and phosphate precursors were maintained at 115 and 20° C., respectively. Argon was used as the carrier gas and the flow rates were set at 175 and 3 sccm for lithium and phosphate precursor, respectively. The lithium and phosphate bubbler pressures were 9.1 and 3.8 Torr, respectively. The precursors were introduced into the chamber through the secondary plenum. The gas lines 32 and 39 and showerhead or bottom plate 21 were heated to 120° C. to prevent condensation. Nitrogen was used as the plasma gas with a flow rate of 90 sccm. A small amount of hydrogen (1 sccm) was added to nitrogen gas to minimize the carbon content in the film. Too much $H_2$ will largely reduce the deposition rate and have a detrimental effect on film properties. The gold-coated ceramic substrate ($Al_2O_3$), produced by Coors Ceramics Company of Golden, Colo., was used as substrate. The system base pressure was approximately 105 Torr and the substrate temperature was set at 180° C. Plasma was started when the chamber pressure reached 1.5 Torr. After plasma was created, the chamber pressure was reduced to 0.35 Torr. The RF power added to the showerhead is 150 Watts. After the plasma was stabilized, the precursor gases were introduced into the chamber through the secondary plenum 23.

The possible reaction in this process can be expressed as:

$$3LiOC_4H_9 + (C_2H_5O)_3PO + 0.23N_2 + H_2 \xrightarrow{RF\ plasma} Li_3PO_{33}N_{0.46} + 3.7H_2O\uparrow + 9C_2H_4\uparrow$$

Figure 9:
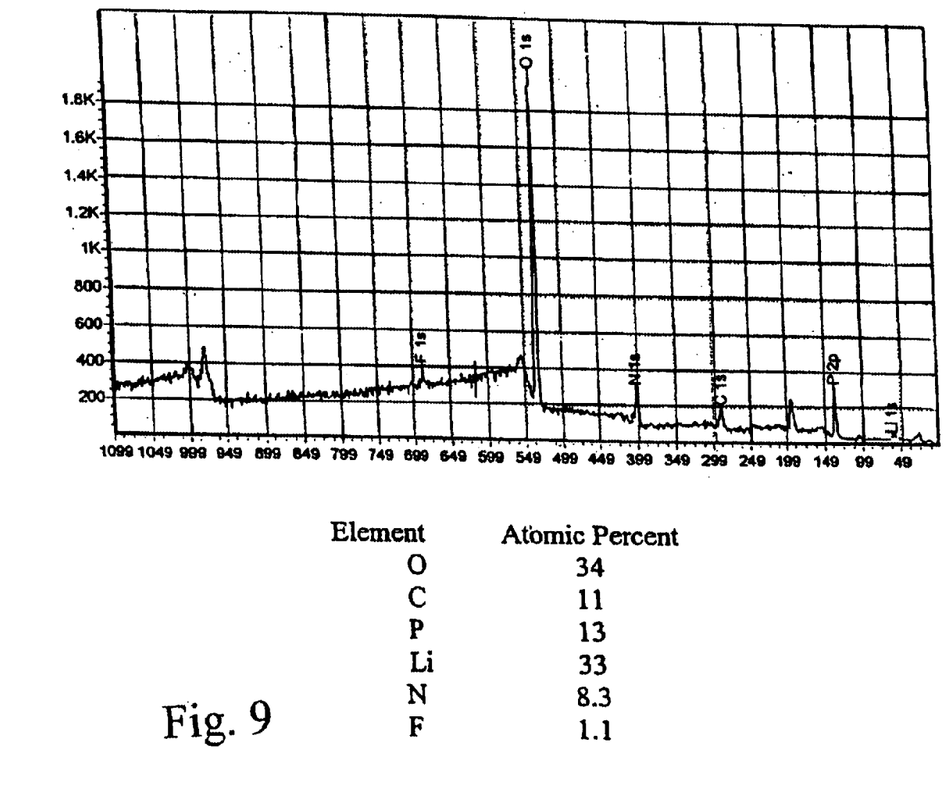
FIG. 9 is a graph which shows the XPS spectrum of an electrolyte film prepared in accordance with the present invention where a small amount of hydrogen was added to nitrogen plasma gas.

In this experiment, the film's growth rate is 29 Å/min. The lithium to phosphorus ratio of the film is 33:13 as revealed by the XPS graph shown in FIG. 9. Electrode impedance spectroscopy indicated that the films exhibit an ionic conductivity of $3.1*10^{-7}$ S/cm.

EXAMPLE II

Figure 10:
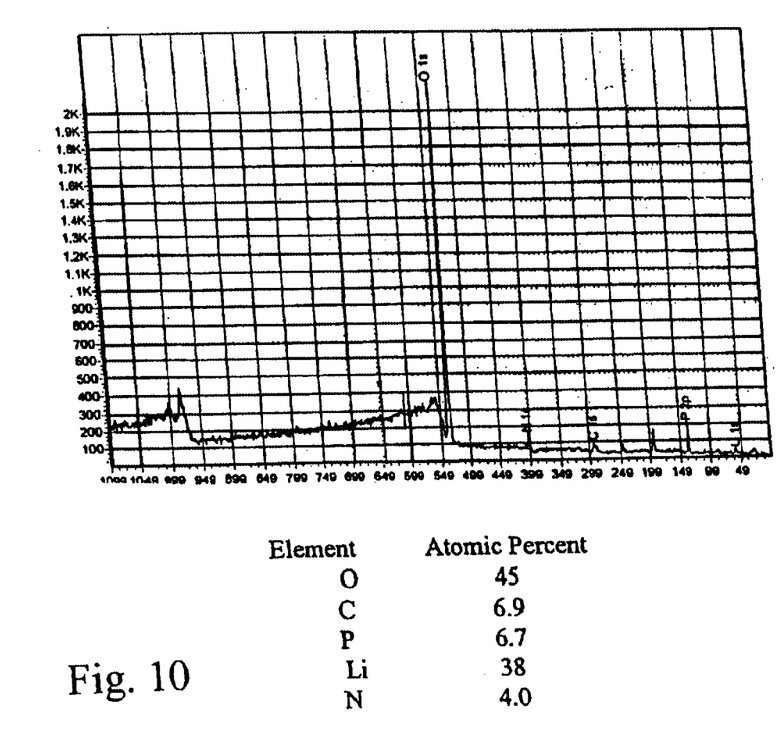
FIG. 10 is a graph which shows the XPS spectrum of an electrolyte film prepared in accordance with the present invention.

In another experiment, similar deposition parameters were used as those described in Example I except that the substrate temperature was set at 160° C. The XPS spectrum of the film is shown in FIG. 10. The film growth rate is 36 Å/min and exhibits an ionic conductivity of $3.5*10^{-7}$ S/cm.

EXAMPLE III

Figure 11:
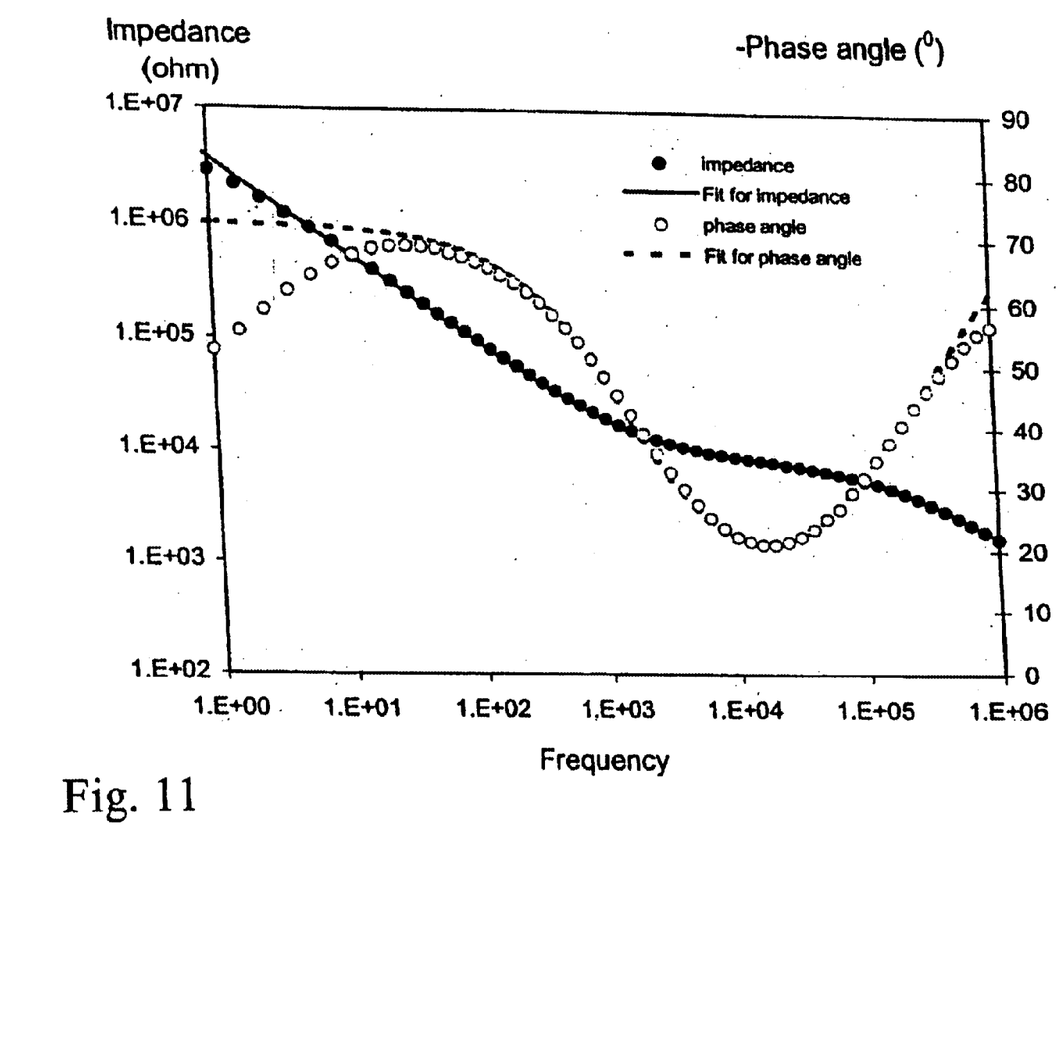
FIG. 11 is a graph which shows the impedance spectra of an electrolyte film prepared in accordance with the present invention.

In another experiment, similar deposition parameters were used as those described in Example I except that the lithium and phosphate bubbler pressures were 10.7 and 8.6 Torr, respectively. The film growth rate was increased to 71 Å/min. The impedance spectrum of the film is shown in FIG. 11. The ionic conductivity of film dramatically increased to $1.9*10^{-6}$ S/cm.

EXAMPLE IV

In yet another experiment, similar deposition parameters were used as those described in Example I except that the lithium and phosphate bubbler pressures were 6.85 and 3.85 Torr, respectively. The film growth rate was dramatically increased to 415 Å/min and the ionic conductivity of the film is $5.8*10^{-6}$ S/cm.

Thus, it should be understood that the present invention produces a solid electrolyte film by directing, entraining or mixing the precursor gases into existing plasma, as opposed to mixing the precursor gases with the plasma gases then generating a plasma with the mixture of gases. This discovery of mixing the precursors with the plasma after the generation of the plasma prevents the precursors from degrading prior to reaching the adjacent substrate, a problem that has long existed with the prior art.

These four experiments show that the LiPON electrolyte films produced by the system and method described herein are extremely similar to that which is produced by conventional RF sputtering techniques. However, the inventive system and method produced these electrolyte films in a much faster and more efficient manner compared to RF sputtering techniques.

It thus is seen that a highly efficient and easily regulated process of producing solid electrolyte thin films is now provided. It should of course be understood that many modifications or additions, in addition to those expressly recited, may be made to the specific preferred embodiment described herein without departure from the spirit and scope of the invention as set forth in the following claims.

What is claimed is:

1. A process for producing a solid electrolyte thin film comprising the steps of:
   (a) providing a plasma source coupled to a supply of plasma gas so as to emit a plasma stream that is directed to a substrate positioned adjacent the plasma source;
   (b) vaporizing a volatile lithium containing precursor;
   (c) vaporizing a volatile phosphate containing precursor;
   (d) transporting the vaporized volatile lithium containing precursor to the plasma source;
   (e) transporting the vaporized volatile phosphate containing precursor to the plasma source; and
   (f) expelling the vaporized volatile lithium containing precursor and vaporized volatile phosphate containing precursor from the plasma source and into the plasma stream emitted from the plasma source,
   whereby the volatile lithium containing precursor and volatile phosphate containing precursor are prevented from mixing with the plasma gas prior to the gas being expelled from the plasma source as a plasma stream.

2. The process of claim 1 wherein the volatile lithium containing precursor is selected from the group consisting of lithium tert-butoxide, lithium hexafluroisoproxide, and lithium tetramethylheptane dionate.

3. The process of claim 1 wherein the volatile phosphate containing precursor is selected from the group consisting of triethylphosphate and trimethyl phosphate.

4. The process of claim 3 wherein the volatile lithium containing precursor is selected from the group consisting of lithium tert-butoxide, lithium hexafluoroisoproxide, and lithium tetramethylheptanedionate.

5. The process of claim 1 wherein the plasma gas is non-reactive with the volatile lithium-containing precursor.

6. The process of claim 1 wherein the plasma gas is reactive with the volatile lithium containing precursor.

7. The process of claim 6 wherein the plasma gas is selected from the group consisting of hydrogen and oxygen.

8. The process of claim 1 wherein the volatile lithium containing precursor is vaporized in step (b) with a metal organic bubbler.

9. The process of claim 1 wherein the volatile phosphate containing precursor is vaporized in step (c) with a metal organic bubbler.

10. A process for producing a thin film electrolyte layer comprising the steps of:
    (a) generating a plasma from a plasma gas;
    (b) vaporizing a volatile lithium containing precursor;
    (c) vaporizing a volatile phosphate containing precursor;
    (d) directing the vaporized volatile lithium containing precursor into the generated plasma;
    (e) directing the vaporized volatile phosphate containing precursor into the generated plasma; and
    (f) directing the plasma mixed with the volatile lithium containing precursor and the volatile phosphate containing precursor onto a substrate,
    whereby the volatile lithium containing precursor and volatile phosphate containing precursor are mixed into the plasma gas only after the plasma is generated.

11. The process of claim 10 wherein the volatile lithium containing precursor is selected from the group consisting of lithium tert-butoxide, lithium hexafluoroisoproxide, and lithium tetramethylheptanedionate.

12. The process of claim 10 wherein the volatile phosphate containing precursor is selected from the group consisting of triethylphosphate and trimethyl phosphate.

13. The process of claim 12 wherein the volatile lithium containing precursor is selected from the group consisting of lithium tert-butoxide, lithium hexafluroisoproxide, and lithium tetramethylheptane dionate.

14. The process of claim 10 wherein the plasma gas is non-reactive with the volatile lithium containing precursor.

15. The process of claim 10 wherein the plasma gas is reactive with the volatile lithium containing precursor.

16. The process of claim 15 wherein the plasma gas is selected from the group consisting of hydrogen and oxygen.

17. The process of claim 10 wherein the volatile lithium containing precursor is vaporized in step (b) with a metal organic bubbler.

18. The process of claim 10 wherein the volatile phosphate containing precursor is vaporized in step (c) with a metal organic bubbler.

* * * * *